(12) United States Patent
Lienau

(10) Patent No.: US 7,177,180 B2
(45) Date of Patent: *Feb. 13, 2007

(54) METHOD AND APPARATUS FOR READING DATA FROM A FERROMAGNETIC MEMORY CELL

(75) Inventor: Richard M. Lienau, Pecos, NM (US)

(73) Assignees: Pageant Technologies, Inc., Toronto (CA); Estancia Limited, Providenciales (TC)

( * ) Notice: Subject to any disclaimer, the term of this patent is extended or adjusted under 35 U.S.C. 154(b) by 0 days.

This patent is subject to a terminal disclaimer.

(21) Appl. No.: 11/089,018

(22) Filed: Mar. 25, 2005

(65) Prior Publication Data

US 2005/0270827 A1 Dec. 8, 2005

Related U.S. Application Data

(63) Continuation of application No. 10/239,377, filed as application No. PCT/US01/07409 on Mar. 8, 2001, now Pat. No. 6,873,546.

(60) Provisional application No. 60/187,981, filed on Mar. 9, 2000.

(51) Int. Cl.
G11C 11/14 (2006.01)

(52) U.S. Cl. ..................... 365/171; 365/173

(58) Field of Classification Search ............. 365/171, 365/173, 158; 257/295
See application file for complete search history.

(56) References Cited

U.S. PATENT DOCUMENTS

| | | | | |
|---|---|---|---|---|
| 4,791,604 A | | 12/1988 | Lienau et al. ................ 365/9 |
| 5,276,639 A | * | 1/1994 | Inoue ........................ 365/162 |
| 5,295,097 A | | 3/1994 | Lienau ...................... 365/170 |
| 5,361,226 A | * | 11/1994 | Taguchi et al. ............ 365/171 |
| 5,640,343 A | | 6/1997 | Gallagher et al. ......... 365/171 |
| 5,793,697 A | | 8/1998 | Scheuerlein ............... 365/230 |
| 5,969,978 A | | 10/1999 | Prinz ......................... 365/98 |
| 6,072,718 A | | 6/2000 | Abraham et al. .......... 365/173 |
| 6,140,139 A | | 10/2000 | Lienau et al. ................ 438/3 |
| 6,229,729 B1 | | 5/2001 | Lienau ...................... 365/145 |
| 6,266,267 B1 | | 7/2001 | Lienau ...................... 365/145 |
| 6,288,929 B1 | | 9/2001 | Lienau ...................... 365/145 |
| 6,317,354 B1 | | 11/2001 | Lienau ...................... 365/145 |
| 6,330,183 B1 | | 12/2001 | Lienau ...................... 365/170 |
| 6,341,080 B1 | | 1/2002 | Lienau et al. ................ 365/66 |

* cited by examiner

Primary Examiner—Anh Phung
(74) Attorney, Agent, or Firm—Morgan, Lewis & Bockius LLP

(57) ABSTRACT

A ferromagnetic memory cell is disclosed. The cell includes a bit (10), made of a ferromagnetic material, having a remnant polarity. The cell also includes a read drive line (20) coupled to a first portion of the bit (10), to feed a current into the bit (10). A sense conductor (30) is coupled to a second portion of the bit (10), to receive the current from the bit (10). The current conducted through the bit (10) is responsive to the polarity of the bit (10). A method is also disclosed for determining the magnetic polarity of a ferromagnetic bit (10). In this method, a bit (10) is provided that is made of ferromagnetic material and has a remnant polarity. An input current (50) is fed into the bit (10) through a read drive line (20) coupled to a first portion of the bit (10). An output current (60) is received from the bit (10) through a sense conductor (30) coupled to a second portion of the bit (10). The current conducted through the bit (10) is responsive to the polarity of the bit (10). A variance between the input current (50) and output current (60) is then sensed, from which the magnetic polarity of the bit (10) is determined.

24 Claims, 5 Drawing Sheets

METHOD AND APPARATUS FOR READING DATA FROM A FERROMAGNETIC MEMORY CELL

This application is a continuation of U.S. application Ser. No. 10/239,377, which was filed Sep. 20, 2002 now U.S. Pat. No. 6,873,546, issued on Mar. 29, 2005 which application claims the benefit under 35 U.S.C. §371 to PCT international application number PCT/US01/07409, which was filed on Mar. 8, 2001, which claims the benefit of provisional U.S. application Ser. No. 60/187,981, which was filed on Mar. 9, 2000, each of which are incorporated by reference in their entirety.

THE FIELD OF THE INVENTION

The present invention relates to reading data from a ferromagnetic memory cell, and more particularly to employing inductive interference to sense the magnetic polarity of the storage medium.

BACKGROUND OF THE INVENTION

In a ferromagnetic memory cell, in which the storage medium is a stick or rod normal to the plane of the substrate, the static magnetic moment, or polarity, of the storage medium must be sampled to determine in which of two directions, north or south, the magnetic field is aligned at sense, or read time. Depending on the polarity of the storage medium, a binary value of "zero" or "one" is read. However, in accomplishing this sampling or sensing, consideration must also be given to the amount of area required by the sensing means. For example, in a matrix of memory cells, in order to accomplish high-density, it is important to reduce the area, or "real estate" required for data sense circuitry, as well as increase data acquisition speed, and lower power requirements.

Examples of patents related to non-volatile ferromagnetic memory cells, each of which are herein incorporated by reference for their supporting teachings, are as follows:

U.S. Pat. No. 4,360,899 to Dimyan et al. teaches a non-volatile random access memory having a plurality of magnetic cells arranged in an array on a major surface of a substrate. In operation, a single magnetic cell is selected and inductively switched between opposite remnant, (i.e. permanent) states, upon the simultaneous application of electrical pulses has an amplitude which is insufficient to inductively switch the remnant state of the selected cell. However, the combined amplitude of the electrical pulses is at least equal to the amplitude required for such a switch.

U.S. Pat. No. 5,068,826 to Mathews teaches a non-volatile, status magnetic memory device, whose operation is based on the Hall effect. The device includes a magnetic patch which stores data in the form of a magnetic field, a semiconductor Hall bar, and a pair of integrally-informed bipolar transistors which are used for amplifying and buffering the Hall voltage produced along the Hall bar. in use, current is forced to flow down the length of the Hall bar causing the Hall voltage to be developed in a direction transverse to the direction of both the magnetic field and the current. The bases of the bipolar transistors are ohmically coupled to the Hall bar to sense the Hall voltage—the polarity of which is representative of the stores information. Finally, a system of current carrying conductors is employed for writing data to individual magnetic patches.

U.S. Pat. No. 5,295,097 to Lienau teaches a nonvolatile random access memory having a substrate that carried separate magnetically polarizable domains. Each domain is surrounded by a full write loop member, and arranged to penetrate a Hall channel of a dual drain FET with its residual magnetic field. The domains are organized in word rows and bit columns, are each written to by a single fill write current through the surrounding loop member, and each read by a comparator connected to the FET drains. Independent separate write lines and read lines are used in writing and reading the values of each magnetic bit.

U.S. Pat. No. 4,791,604 to Lienau et al. teaches a sheet random access memory (SHRAM). The SHRAM is a non-volatile and transportable memory characterized by its cell density and relatively small size and power requirements, but having the nonvolatile character and rugged transportability of core memory, or magnetic disks or tape. The SHRAM is further characterized by a memory comprising a two dimensional magnetic substrate and a fixed driving device for writing and reading into the substrate. Further, a fixed sensing device for sensing the information is attached at each cell location. The memory media includes not only a homogeneous two dimensional substrate, but also ferrite cores formed into the substrate by photolithographic techniques, wherein the information is stores within the cores and read by the sensing device from a gap defined by the core. Memory cells according to the invention can thus be arranged and organized to form destructive readout RAMs, or nondestructive readout Rams, in both serial and parallel form.

U.S. Pat. No. 5,926,414 to McDowell et al. teaches a magnetic integrated circuit structure in combination with a carrier-deflection-type magnetic field sensor. Each of a variety of magnet structures realize a condition in which the magnetic field is substantially orthogonal to the direction of travel of carriers of a sense current, thereby achieving maximum sensitivity. By basing a magnetic memory cell on a single minimum size MOS device, a small cell may be realized that compares favorably with a conventional DRAM of FLASH memory cell. The greater degree of control over the magnetic field afforded by the magnetic structures enables the cross-coupling between cells in a memory array to be minimized.

U.S. Pat. No. 3,727,199 to Lekven teaches a magnet memory element and a process for producing such elements in plurality to constitute a static magnetic memory or digital information storage system. Individual binary storage members are afforded directionally preferential magnetic characteristics by flux circuits to establish the preferred axis of magnetization. Conductors for driving the individual binary storage members (for storing and sensing) are provided in an organized pattern to accomplish selectivity. A batch production process is also disclosed.

To date, there have been no commercial examples of non-volatile ferromagnetic memories, capable of both random write and random read, with truly simple data sense circuitry.

SUMMARY OF THE INVENTION

It is therefore a feature of the present invention to provide a non-volatile ferromagnetic memories, capable of both random write and random read, with truly simple data sense circuitry.

The present invention relates to reading data from a ferromagnetic memory cell, and more particularly to employing inductive interference to sense the magnetic polarity of the storage medium.

The ferromagnetic memory cell contains a bit made of a ferromagnetic material that has a remnant polarity. The cell also contains a read drive line coupled to a first portion of the bit through which a current is fed into the bit. On a second portion of the bit is a sense conductor. The sense conductor receives the current from the bit and the current conducted through the bit is responsive to the polarity of the bit.

In one embodiment, the read drive line is positioned approximately perpendicular to a central axis running lengthwise through the bit. The read drive line may also be positioned along a top edge of the bit. Similarly, the sense conductor may be positioned approximately perpendicular to the central axis or positioned along a bottom edge of the bit. Furthermore, the read drive line may be oriented at approximately a ninety degree (90°) angle relative to the sense conductor.

In a preferred embodiment both the read drive line and the sense conductor are in direct contact with the bit. The bit also preferably has a height to width aspect ratio of greater than 1:1.

A method of determining a magnetic polarity of a ferromagnetic bit is also disclosed. In this method a bit is provided that is made of a ferromagnetic material, and has a remnant polarity. An input current is fed through a read drive line that is coupled to a first portion of the bit. An output current is then received from the bit through a sense conductor coupled to a second portion of the bit. Again, the current conducted through the bit is responsive to the polarity of the bit. A variance between the input current and the output current is sensed, from which the magnetic polarity of the bit is determined.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

It is noted that the drawings of the invention are not to scale. The drawings are merely schematic representations, not intended to portray specific parameters of the invention. The drawings are intended to depict only selected embodiments of the invention, and therefore should not be considered to be limiting the scope of the invention. The invention will be described with additional specificity and detail through the use of the accompanying drawings. Like numbering between figures represent like elements.

DETAILED DESCRIPTION OF THE PREFERRED EMBODIMENT(S)

Figure 5:
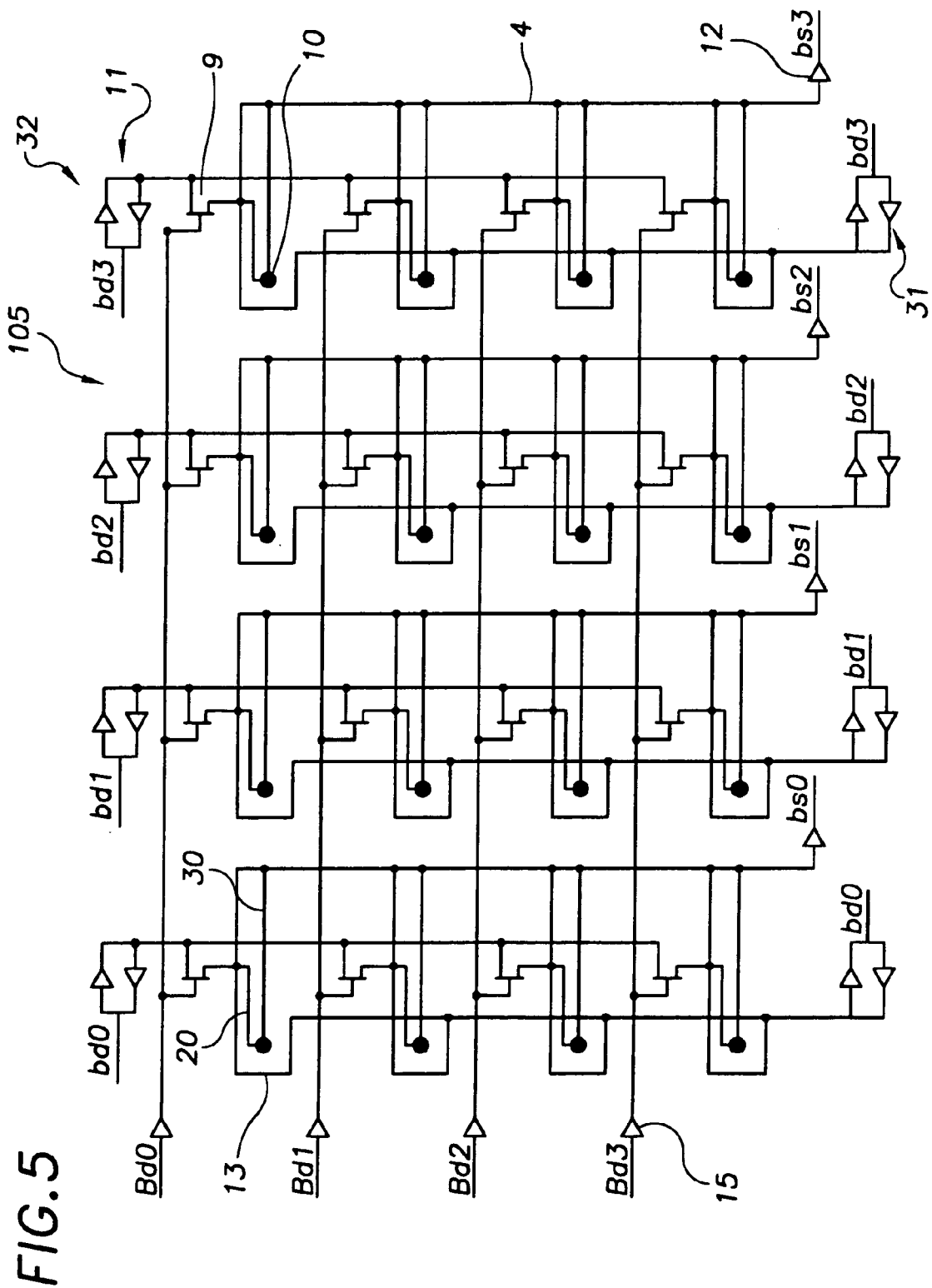
FIG. 5 is a partial schematic of a four-by-four random access memory matrix.
Figure 6:
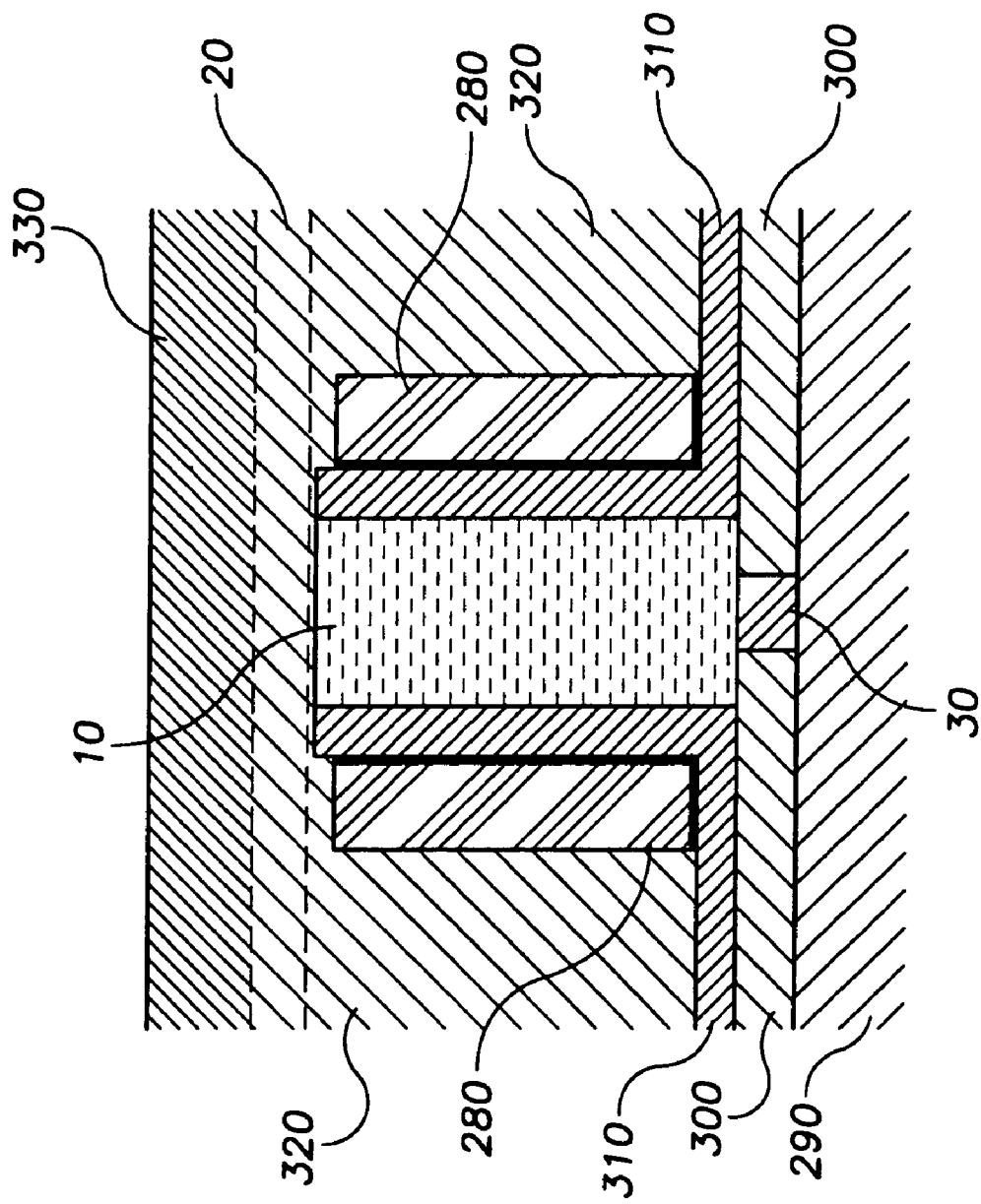
FIGS. 6 & 7 show cross-sectional views of two preferred embodiments of the memory cell.
Figure 7:
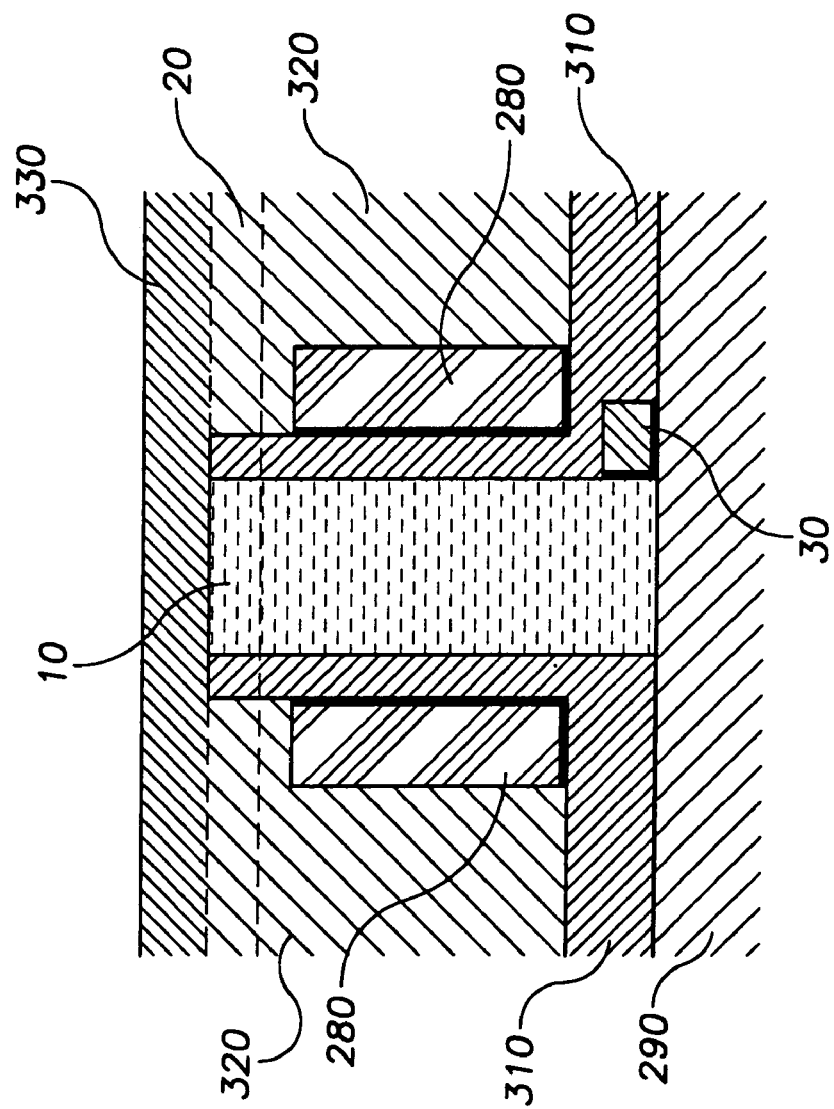

FIGS. 1A, 1B, 2A and 2B are cross-sectional and oblique representations, respectively, of a ferromagnetic memory cell comprised of a micron or sub-micron sized ferromagnetic bit 10 whose aspect ratio is greater than 1:1 (i.e., 2:1. etc.), deposited normal to the plane of the substrate. The bit 10, which can be a stick or rod, is in communication with a byte, or word, drive conductor 20 at one end. The other end of the bit 10 is in communication with a bit sense conductor 30. The data set, or write drive, coil 280 (as seen in FIGS. 5–7) is not shown for the sake of clarity.

Figure 1A:
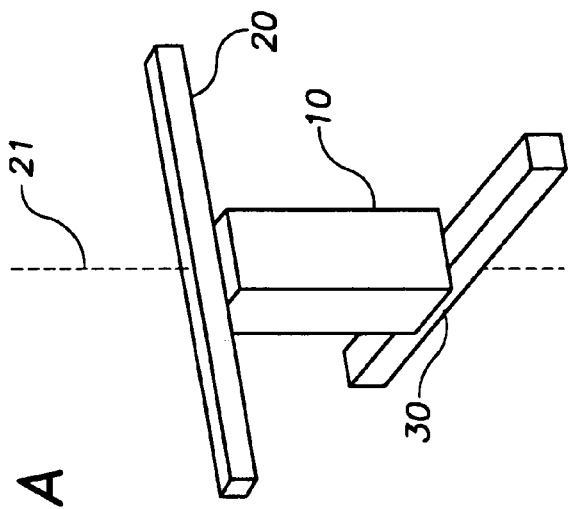
FIGS. 1A & 1B are cross-sectional representations of a ferromagnetic memory cell.
Figure 2A:
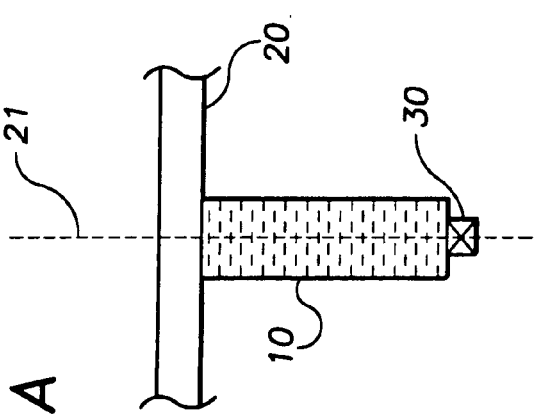
FIGS. 2A & 2B are oblique representations of a ferromagnetic memory cell.

FIGS. 1A and 2A show an embodiment of the present invention wherein the byte, or 20 word, drive conductor 20 is approximately perpendicular to an axis 21 running lengthwise through the bit 10. The bit sense conductor 30 is also approximately perpendicular to the axis 21, and is oriented about ninety degrees (90°) relative to the orientation of the byte drive conductor 20.

Figure 1B:
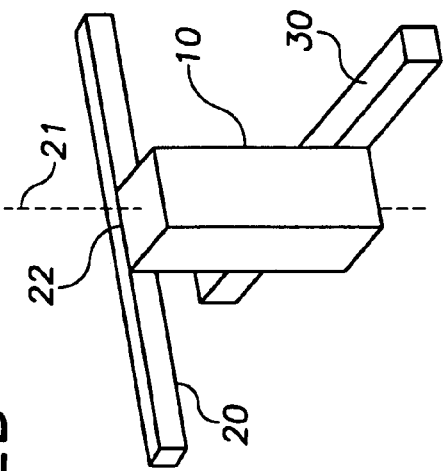
Figure 2B:
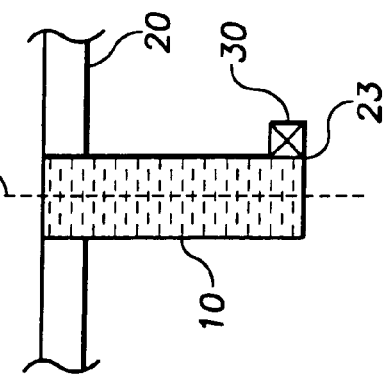

FIGS. 1B and 2B show an embodiment of the present invention wherein the byte drive conductor 20 runs along a top edge 22 of the bit 10. The sense conductor 30 runs along a bottom edge 23 of the bit 10 and is oriented approximately ninety degrees (90°) relative to the orientation of the byte drive conductor 20.

These two figures represent two different approaches to the electrical relationship of the read drive 10 and read sense 30 conductors to the ferromagnetic bit 10. Electrically, there is no essential difference between these two embodiments, but one may be preferred over the other for purposes of fabrication.

Figure 3:
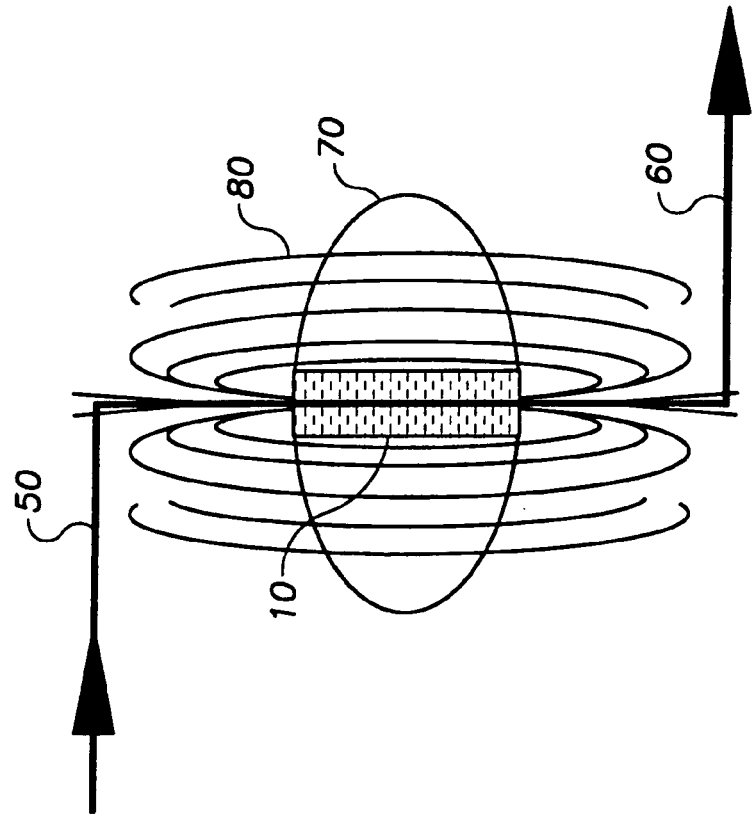
FIG. 3 shows a representation of the ferromagnetic bit and pulse current traveling through the bit.

In FIG. 3 the pulse current, as it travels through the ferromagnetic bit 10, is schematically shown. The pulse current is characterized by an in input portion 50, which is the current as it is directed into the bit 10, and an output portion 60, which is the current as it comes out of the bit 10. The E and H fields generated by the AC components of the pulse are represented by features 70 and 80 respectively.

Figure 4:
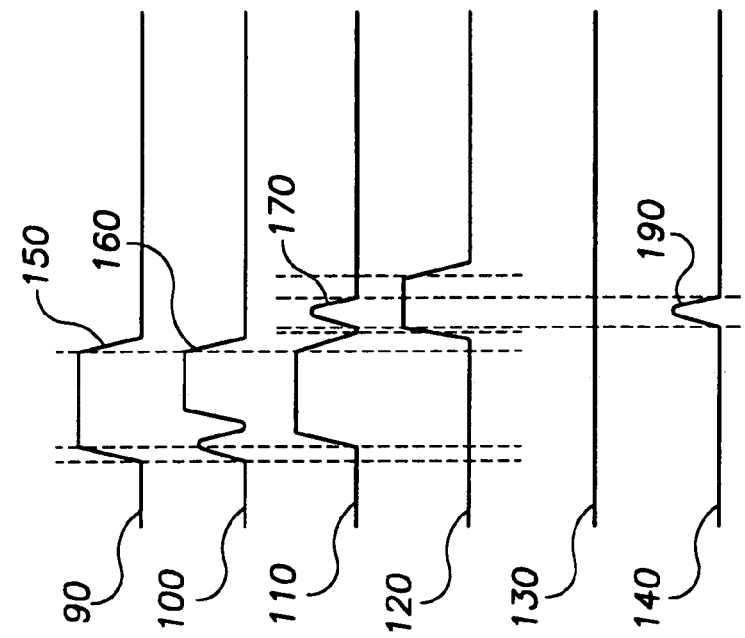
FIG. 4 is a data sense, or read timing chart.

FIG. 4 is a data sense, or read, timing chart. Reading the chart from top to bottom, line 90 represents the byte drive line with the raw input pulse 150 injected at read, or sense, time. Line 100 represents one of two bit sense, or read, output lines as seen from the opposite end of the ferromagnetic bit. Line 110 represents the second output. These two cases demonstrate the proximate result from feeding the pulse 150 longitudinally through the bit with opposite remnant magnetic fields. Line 120 represents the read, or data sense, strobe present during data sense, or read time, at the sense circuitry to which the bit sense conductor is electrically connected. Lines 130 & 140 show the results from the two different outputs 160 & 170. Line 130 is at zero (0) volts, while line 140 shows a gated pulse 190. Thus, with these differing outputs, the differing binary conditions of the ferromagnetic bit can be determined. Note that no representation is made as to which pulse or output is north or south, or represents a binary "zero" or "one," in addition, the representations made may prove to be different in reality.

The embodiment in FIG. 5, shows a partial schematic of a four by four random access memory matrix 105 of the present invention. A plurality of individual ferromagnetic bits 10 are each surrounded by a coil which surrounds up to and including 270°, and is intimate to the ferromagnetic stick. The coil is also referred to as a write or drive line 13. The read drive line or byte conductor 20 is coupled to a first portion of the ferromagnetic bit 10. The bit output or sense conductor 30 is coupled to a second portion of the bit 10.

The sense conductor 30 is coupled to a sense line 4. Notably, the byte and sense conductors are preferably coupled at opposite ends of each bit (not shown in this figure). The control circuitry 32 comprises a read/write drive circuit 11, a read/write switch 9 (in the form of an FET), and an input amplifier 15. The control circuitry 32 is coupled to the write line 13, and to the read drive conductor or read drive line 20. This dual coupling allows the control 32 to be used during both write and sense read operations. A write drive circuit 31 is also coupled to the write line 13, as illustrated. Additionally, an amplifier 12 is coupled to sense line 45 as illustrated.

During write operations of a single memory cell, appropriate segments of the control circuit 32 and write drive circuit 31 are activated simultaneously. One skilled in the art will easily understand that current is directed in a desired direction, around any given memory cell, to set a logical "0" or "1" into the bit.

At data sense, or read, time, a pulse 50, whose duration, amplitude and polarity are the same during each and every data sample time, is introduced from the byte drive conductor 20, which flows longitudinally through the ferromagnetic stick, or bit 10, to the bit sense conductor 30. As the pulse courses through the ferromagnetic bit 10, the rising and falling E field 70 generated by the AC components of the pulse cross the remnant magnetic field of the ferromagnetic bit 10 at an angle of ninety degrees (90°), while the H, or magnetic component, field 80 crosses at zero degrees (0°). The disturbance caused by the mutual interference of these fields reflects into the pulse current 60, causing the output which appears on the bit sense conductor to be at variance with the input. This variance is sensed by circuitry electrically connected to the bit sense conductor, allowing determination of the polarity of the remnant magnetic field of the bit 10, and thus the binary value, that is, a "zero" or a "one".

During read operations of a single memory cell, appropriate sections of the control circuit 32 and sense amplifier 12 are simultaneously activated. Thus, one skilled in the art will easily understand how individual memory cells can be read. It is noted that by using the same control circuit 32 in combination with the read 12 and write 31 circuits, there is an overall reduction in the amount of circuitry needed to operate the memory cell. This circuitry is representative only, and can be designed any number of different ways by those familiar with the art.

FIGS. 6 and 7 show cross-sections of preferred embodiments of the above-described memory cell fabricated at the micron, sub-micron, or smaller scale. There is no functional difference between these configurations. The difference is that in FIG. 6, the word sense drive 20 and the bit sense conductor 30 are shown positioned more or less centered at each end of the ferromagnetic stock, or bit 10. FIG. 7 however, illustrates that the sense drive and bit sense conductor can be offset to the sides of the bit 10. All conductors or lines may be made of Al, Cu, or any other suitable material. The write, or data set, coil 280 is shown in both FIGS. 6 and 7. The substrate 290 may be made of any suitable material such as glass, silicon, or GaAs. Insulating materials 310, 320, and 330 may be of an appropriate material such $SiO_2$ or $Si_3N_4$, etc.

It is noted that in this depiction, matrix interconnects are not shown for the sake of clarity. It is also noted that several methods may be employed to make the present invention, including, but not limited to, electroplating, sputtering, E-beam deposition, chemical vapor deposition and molecular beam epitaxy.

Furthermore, FIGS. 1A, 1B, 2A, 2B and 5 depict the ferromagnetic memory cell as part of a matrix of cells. However, the invention may be used in connection with any high-speed, dense, nonvolatile digital memory or other circuitry where any amount of memory, including single bits, may be required. This could be in all manner of digital circuitry, including computers, robotics, telephone and automotive circuits, security devices, and so on.

Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function, manner of operation, assembly, and use may be made without departing from the principles and concepts set forth herein.

What is claimed is:

1. A memory cell comprising:
   a) a bit (10);
   b) a read drive line (20) coupled to a first portion of the bit (10), to feed a current into the bit (10); and
   c) a sense conductor (30) coupled to a second portion of the bit (10), to receive the current from the bit (10), wherein the current conducted through the bit is responsive to the polarity of the bit.

2. The memory cell of claim 1, wherein the bit is a magnetic material.

3. The memory cell of claim 2, wherein the magnetic material is a ferromagnetic material.

4. The memory cell of claim 3, wherein the read drive line is oriented at approximately a ninety degree (90°) angle relative to the sense conductor.

5. The memory cell of claim 3, wherein the sense conductor is in direct contact with the bit.

6. The memory cell of claim 1, wherein the read drive line is positioned approximately perpendicular to a central axis (21) running lengthwise through the bit.

7. The memory cell of claim 2, wherein the sense conductor is positioned approximately perpendicular to the central axis.

8. The memory cell of claim 2, wherein the read drive line is in direct contact with the bit.

9. The ferromagnetic memory cell of claim 1, wherein the bit has a height to width aspect ratio of greater than 1:1.

10. A memory cell comprising:
    a) a bit (10):
    b) a read drive line (20) coupled to a first portion of the bit (10), to feed a current into the bit (10), wherein the read drive line is positioned along a top edge (22) of the bit; and
    c) a sense conductor (30) coupled to a second portion of the bit (10), to receive the current from the bit (10), wherein the current conducted through the bit is responsive to the polarity of the bit.

11. The memory cell of claim 10, wherein the sense conductor is positioned along a bottom edge (23) of the bit.

12. The ferromagnetic memory cell of claim 11, wherein the read drive line is oriented at approximately a ninety degree (90°) angle relative to the sense conductor.

13. The ferromagnetic memory cell of claim 11, wherein the sense conductor is in direct contact with the bit.

14. The ferromagnetic memory cell of claim 10, wherein the read drive line is in direct contact with the bit.

15. A method of determining a magnetic polarity of a bit comprising the steps of:
   a) providing a bit (10) having a remnant polarity;
   b) feeding an input current (50) into the bit through a read drive line (20) coupled to a first portion of the bit (10); and
   c) receiving an output current (60) from the bit through a sense conductor (30) coupled to a second portion of the bit (10), wherein the current conducted through the bit is responsive to the polarity of the bit;
   d) sensing a variance between the input current and the output current; and
   e) determining the polarity of the bit from the variance.

16. The method of claim 15, wherein the bit is made of a magnetic material.

17. The method of claim 16, wherein the magnetic material is a ferromagnetic material.

18. The method of claim 15, wherein the read drive line is positioned approximately perpendicular to a central axis running lengthwise through the bit.

19. The method of claim 18, wherein the sense conductor is positioned approximately perpendicular to the central axis.

20. The method of claim 19 wherein the read drive line is oriented at approximately a ninety degree (90°) angle relative to the sense conductor.

21. The method of claim 15, wherein the bit has a height to width aspect ratio of greater than 1:1.

22. A method of determining a magnetic polarity of a bit comprising the steps of:
   a) providing a bit (10) having a remnant polarity;
   b) feeding an input current (50) into the bit through a read drive line (20) coupled to a first portion of the bit (10), wherein the read drive line is positioned along a top edge (22) of the bit; and
   c) receiving an output current (60) from the bit through a sense conductor (30) coupled to a second portion of the bit (10), wherein the current conducted through the bit is responsive to the polarity of the bit;
   d) sensing a variance between the input current and the output current; and
   e) determining the polarity of the bit from the variance.

23. The method of claim 22, wherein the sense conductor is positioned along a bottom edge of the bit.

24. The method of claim 23, wherein the read drive line is oriented at approximately a ninety degree (90°) angle relative to the sense conductor.

* * * * *